(12) United States Patent
Fujii et al.

(10) Patent No.: US 8,088,495 B2
(45) Date of Patent: *Jan. 3, 2012

(54) WIRING MATERIAL, WIRING SUBSTRATE AND MANUFACTURING METHOD THEREOF, DISPLAY PANEL, FINE PARTICLE THIN FILM MATERIAL, SUBSTRATE INCLUDING THIN FILM LAYER AND MANUFACTURING METHOD THEREOF

(75) Inventors: Akiyoshi Fujii, Nara (JP); Toshio Tahira, Tenri (JP); Nobukazu Nagae, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 19 days.

This patent is subject to a terminal disclaimer.

(21) Appl. No.: 12/642,209

(22) Filed: Dec. 18, 2009

(65) Prior Publication Data
US 2010/0098937 A1    Apr. 22, 2010

Related U.S. Application Data

(62) Division of application No. 10/755,398, filed on Jan. 13, 2004, now Pat. No. 7,718,273.

(30) Foreign Application Priority Data

Jan. 14, 2003   (JP) ................................. 2003-006268

(51) Int. Cl.
    *B32B 5/16*    (2006.01)
(52) U.S. Cl. ........ 428/560; 428/209; 428/323; 428/547; 428/548; 428/551; 174/259; 228/122.1
(58) Field of Classification Search .................. 428/209, 428/560, 323, 547, 548, 551; 174/259; 228/122.1
See application file for complete search history.

(56) References Cited

U.S. PATENT DOCUMENTS

| | | |
|---|---|---|
| 2,963,748 A | 12/1960 | Young |
| 3,031,344 A | 4/1962 | Sher et al. |
| 3,506,482 A | 4/1970 | Hirohata et al. |
| 4,248,921 A | 2/1981 | Steigerwald et al. |
| 4,327,124 A | 4/1982 | DesMarais, Jr. |
| 4,404,237 A | 9/1983 | Eichelberger et al. |

(Continued)

FOREIGN PATENT DOCUMENTS

GB        678-717        9/1952

(Continued)

OTHER PUBLICATIONS

Advisory Action mailed Aug. 17, 2009 for U.S. Appl. No. 10/755,398.

(Continued)

*Primary Examiner* — Cathy Lam
(74) *Attorney, Agent, or Firm* — Birch, Stewart, Kolasch & Birch, LLP

(57) ABSTRACT

The present invention provides a wiring material for forming wiring on a substrate by causing coalescence of conductive particles through heating, and including a binder layer and a wiring layer. The binder layer contains metal particles and having a binder function to be adhered to the substrate; and the wiring layer contains metal particles and laminated on the binder layer. The metal particles of the binder layer and the metal particles of the wiring layer are in contact with each other. With this arrangement, it is possible to provide a wiring material allowing use of a larger variety of materials, while also ensuring low resistance of wiring and improvement of adhesion between the wiring and the substrate.

23 Claims, 8 Drawing Sheets

U.S. PATENT DOCUMENTS

| | | | |
|---|---|---|---|
| 4,581,301 A | 4/1986 | Michaelson | |
| 5,114,744 A | 5/1992 | Cloutier et al. | |
| 6,486,413 B1 | 11/2002 | Ogure | |
| 6,651,871 B2 * | 11/2003 | Ogure | 228/248.1 |
| 6,803,175 B2 * | 10/2004 | Kobayashi | 430/322 |
| 6,846,616 B2 * | 1/2005 | Kobayashi et al. | 430/311 |
| 7,575,845 B2 * | 8/2009 | Kobayashi et al. | 430/270.1 |

FOREIGN PATENT DOCUMENTS

| | | |
|---|---|---|
| JP | 64-31493 A | 2/1989 |
| JP | 03-059913 A | 3/1991 |
| JP | 03-179794 A | 8/1991 |
| JP | 3-246990 A | 11/1991 |
| JP | 03-263391 A | 11/1991 |
| JP | 05-090209 A | 4/1993 |
| JP | 5-303127 A | 11/1993 |
| JP | 07-074445 | 3/1995 |
| JP | 8-77832 A | 3/1996 |
| JP | 10-51089 A | 2/1998 |
| JP | 11-080618 A | 3/1999 |
| JP | 11-135904 A | 5/1999 |
| JP | 2000-249821 A | 9/2000 |
| JP | 2001-144417 A | 5/2001 |
| JP | 2002-299833 A | 10/2002 |

OTHER PUBLICATIONS

Advisory Action mailed Aug. 22, 2008 for U.S. Appl. No. 10/755,398.
Final Office Action mailed Jun. 11, 2009 for U.S. Appl. No. 10/755,398.
Final Office Action mailed May 6, 2008 for U.S. Appl. No. 10/755,398.
Final Office Action mailed May 9, 2006 for U.S. Appl. No. 10/755,398.
Non-Final Office Action mailed Aug. 11, 2006 for U.S. Appl. No. 10/755,398.
Non-Final Office Action mailed Dec. 15, 2008 for U.S. Appl. No. 10/755,398.
Non-Final Office Action mailed Mar. 8, 2007 for U.S. Appl. No. 10/755,398.
Non-Final Office Action mailed Nov. 17, 2005 for U.S. Appl. No. 10/755,398.
Notice of Allowance and Fees Due mailed Jan. 13, 2010 for U.S. Appl. No. 10/755,398.
Notice of Panel Decision from Pre-Appeal Brief Review mailed Oct. 8, 2009 for U.S. Appl. No. 10/755,398.

* cited by examiner

BEFORE SINTERING        AFTER SINTERING

WIRING MATERIAL, WIRING SUBSTRATE AND MANUFACTURING METHOD THEREOF, DISPLAY PANEL, FINE PARTICLE THIN FILM MATERIAL, SUBSTRATE INCLUDING THIN FILM LAYER AND MANUFACTURING METHOD THEREOF

This application is a Divisional of application Ser. No. 10/755,398, filed on Jan. 13, 2004, now U.S. Pat. No. 7,718,273; the entire contents of which are hereby incorporated by reference and for which priority is claimed under 35 U.S.C. §120, which is a Nonprovisional application and claims priority under 35 U.S.C. §119(a) on Patent Application No. 2003/6268 filed in Japan on Jan. 14, 2003, the entire contents of which are hereby incorporated by reference.

FIELD OF THE INVENTION

The present invention relates to a wiring material containing conductive particles, a wiring substrate created by forming the wiring material on a substrate, and the manufacturing method thereof, and a display panel using the wiring substrate; and further relates to a fine particle thin film material, a substrate including thin film layer and manufacturing method thereof.

BACKGROUND OF THE INVENTION

To form a wiring substrate with metal particles, generally used is a method of applying metal paste, which is an adhesive or paste containing metal particles, to a substrate through coating or printing.

Among various kinds of metal paste, the most common example is one containing silver (Ag) particles, which is used for electrical connection between terminals, or mending of disconnection. Such a metal paste normally contains metal fine particles in size of several microns to several ten microns, and it causes electrical coupling by using contact force between the respective particles (intermolecular force). As well as the metal particles, general metal paste contains a corrosion-resistant material, an adhesive material such as an epoxy, or solvents of this material etc.

Further, in recent years, finer metal particles with diameters of several nanometers to several tens nanometers (hereinafter referred to as ultrafine particles) has been attracting much attention. With the small diameters, the ultrafine particles offer such advantages that they are in touch with an object with more contact points between themselves and the object; they can constitute a thinner film; and they ensure superior flatness of the surface of substrate, etc.

Further, for the ultrafine particles around 100 nanometers or smaller, their characteristics, such as a decrease of melting point or an increase of reactivity (which are called size effect) becomes more considerable. Accordingly, a decrease of size causes a significant increase of surface energy with respect to internal energy.

When such ultrafine particles with high surface energy are in contact with each other, they are easily coalesced together, and the coalescing state is maintained until the size effect wears off. Thus, a metal thin film made up of ultrafine particles coalesced to each other offer a low resistance value, more closer to a bulk, compared to a material in which metal particles are not coalesced but aligned, and electrical conduction was made only by contact force between the particles.

The ultrafine metal particles with the described characteristics have already been used as a wiring material. One example is a conductive paste containing both large metal particles (with a diameter of μms) and ultrafine metal particles (with a diameter of nms). In this conductive paste, the ultrafine particles fill the respective gaps between the large metal particles, thus offering a low resistance.

Further, another example of a wiring material made of ultrafine metal particles is a colloid material in which the ultrafine particles coated with an organic material are dispersed in a solvent. The colloid material allows easy formation of a metal thin film by being applied to the object and then by being subjected to baking. In this manner, the organic material coating the ultrafine particles are evaporated through baking, and therefore the ultrafine metal particles are easily coalesced, thus easily forming a metal thin film with a resistance close to a bulk.

Incidentally, because of their small diameters, the ultrafine metal particles are energetically active, and their reactivity relies on the activity. Therefore, when the ultrafine metal particles are applied to the object having a metal surface so as to form a film, the metal surface and the ultrafine metal particles are coupled with each other. Thus, the created film will not remove from the metal surface.

However, when the object to which a film is formed by being coated with ultra fine particles is an insulative material such as an oxide, the ultrafine metal particles are only placed on the insulative material unlike the case of sputtering or vapor deposition in which the particles are injected into the object by some energy. Therefore, particularly for the ultrafine metal particles having low reactivity with respect to other materials such as a noble metal, the applied particles are more easily removed from the surface, thus immediately failing "a peel test" using a tape.

In view of this problem, Document 1 (Japanese Laid-Open Patent Application Tokukaihei 03-263391/1991 (published on Nov. 22, 1991) discloses a method (first method) using a wiring material in which ultrafine metal particles contain several % by weight of glass frit. Also Document 2 (Japanese Laid-Open Patent Application Tokukaihei 03-179794/1991 (published on Aug. 5, 1991) discloses a method (second method) of applying an epoxy adhesive, which is either cured or half-cured, on a surface coated with an insulative material, and applying ultrafine metal particles on the surface, which is then pressed and heated. Further, FIG. 8 shows still another method disclosed in Document 3 (Japanese Laid-Open Patent Application Tokukaihei 11-80618/1999 (published on Mar. 26, 1999), in which a substrate 101 coated with ultrafine metal particles 103 is baked, and then further coated with silica material 102, which is cured after application.

Incidentally, the wiring material containing glass frit, such as the one used in the first method, ensures adhesion between the wiring and the insulative material. However, since the glass frit operates as a resistance component in the wiring, the wiring should contain as small amount of glass frit as possible, so as to obtain a low resistance close to the wiring formed by a metal (such as Al) through sputtering, vapor deposition or the like.

However, when the wiring contains less amount of glass frit, there arise a problem of removal of the wiring from the substrate.

Therefore, the first method cannot ensure both of the adhesion between the wiring and the substrate, and the low resistance of the substrate.

Further, in the second method of applying a cured or half-cured epoxy adhesive on a surface coated with an insulative material, and applying ultrafine metal particles on the surface, which is then pressed and heated; the pressing may cause deformation of the wiring material in case of forming a thin film, thus arising a risk of breakage of wires.

Further, in the second method, the adhesive is used to ensure adhesion with the substrate, and therefore some kinds of metal particles can remove from the adhesive. Accordingly, the second method requires ultrafine metal particles with superior adhesion with respect to the adhesive. To meet this requirement, the material for wiring has to be selected from a smaller range.

Further, in the third method of applying and curing a silica material on ultrafine metal particles applied on a substrate; the silica material only fixes the wiring to the insulative material to prevent the wiring from being removed from the insulative material, but it does nothing to improve adhesion between the wiring and the insulative material. Thus, there is still a risk of removal of the wiring depending on the occupied area of the film of ultrafine metal particles formed on the substrate, if the adherence between the metal ultrafine particles and the silica material are not ensured.

Further, in the third method, adhesion between the wiring and the substrate is ensured with permeation of the silica material through the gaps between the ultrafine metal particles. Thus, the adherence can be ensured when the film is thin enough to provide sufficient gaps between the ultrafine particles; however, when the ultrafine metal particles are coalesced with each other to become a continuous film, and the silica material can no longer permeated through the gaps between the particles. Thus, the third method cannot ensure improvement of adhesion between the wiring and the insulative material either. Further, through such a processing, the silica covers the surface of the film, thus causing some difficulties for making electrical contact from the surface.

SUMMARY OF THE INVENTION

The present invention is made in view of the foregoing conventional problems, and an object is to provide a wiring material and a wiring substrate allowing use of a larger variety of materials, while also ensuring low resistance of wiring and improvement of adhesion between the wiring and the substrate.

In order to solve the foregoing problems, a wiring material according to the present invention, for forming wiring on a substrate by causing coalescence of conductive particles through heating, includes: a first layer containing conductive particles and having a binder function to be adhered to the substrate; and a second layer containing conductive particles and laminated on the first layer.

With the foregoing arrangement in which the first layer and the second layer are laminated to each other, the conductive particles of the first layer are partly in contact with the conductive particles of the second layer.

By carrying out heat processing with such an arrangement, the conductive particles included in the second layer are coalesced with each other to become wiring, and also coalesced with the conductive particles included in the first layer which is in contact with the second layer. Thus, the conductive particles in the first layer and the conductive particles in the second layer are coalesced with each other. Further, the conductive particles included in the first layer are firmly adhered to the first layer with the binding function. Further, the created wiring includes the conductive particles coalesced with each other through the heat processing, thus offering low resistance to the created wiring.

Therefore, the wiring formed by subjecting the second layer to heat processing is also firmly connected to the first layer. Further the first layer is adhered to the substrate with its binding function. Accordingly, the wiring formed by subjecting the second layer, which is firmly bonded to the first layer, to heat processing is also firmly connected to the substrate via the first layer, thus preventing the wiring from coming off the substrate.

Besides, since the first layer and the second layer are coupled together by coalescence between the respective conductive particles, the conductive particles for constituting the second layer can be selected with no account of adherence between the first layer and the second layer. On the other hand, the material of the first layer can be selected from any materials ensuring high adhesiveness with respect the substrate, regardless of the material of the conductive particles constituting the second layer.

Accordingly, it is possible to provide a wiring material allowing use of a larger variety of materials, while also ensuring low resistance of wiring and improvement of adhesion between the wiring and the substrate.

The conductive particles used in such an arrangement are made of a conductive material with a diameter of not more than 100 nm. The conductive material is selected in view of a characteristic allowing the conductive particles to be easily coalesced with each other by heating. One suitable example of such a conductive material may be a metal material.

The conductive material made of a metal material becomes energetically active in a state of ultrafine particles with a diameter of not more than 100 nm, and therefore, the metal particles are coalesced with each other even at a temperature below the fusing point, thus easily forming a metal film.

In order to solve the foregoing problems, a wiring substrate according to the present invention includes: a first layer containing conductive particles and adhered to a substrate; and a second layer operating as a wiring layer made of a conductive material and laminated on the first layer, the conductive particles of the first layer and the conductive material of the second layer are coalesced with each other at a border of the first layer and the second layer so as to generate an anchor effect for unifying the first layer and the second layer.

With the foregoing arrangement, the first layer is adhered to the substrate, and the first layer and the second layer are bonded together by the anchor effect, thus preventing the second layer from coming off the substrate via the first layer.

Further, the first layer and the second layer are bonded together by the anchor effect, the conductive particles for constituting the first layer can be selected with no account of adherence with the material of the second layer. More specifically, the material of the first layer can be selected only by taking account of adhesiveness with respect to the substrate.

The foregoing wiring material may be arranged so that the conductive particles are metal particles, and the conductive material is a metal material, and the anchor member is made of metal grains created from the metal particles and the metal material.

In this case, since the conductive material made of a metal material easily realizes low resistance of the second layer, it is possible to realize a wiring material offering low resistance of wiring and ensuring adhesion between the wiring and the substrate.

In order to solve the foregoing problems, a manufacturing method of a wiring substrate according to the present invention includes the steps of: (a) forming a first layer on a substrate, the first layer containing conductive particles and having a binder function to be adhered to the substrate; (b) forming on the first layer formed in the step (a) a second layer containing conductive particles; and (c) subjecting the first and second layers laminated to each other to heat processing, so as to coalesce the conductive particles of the first layer and the conductive particles of the second layer at a border of the first and second layers.

With the foregoing method in which the first layer and the second layer laminated to each other are subjected to heat processing together, the conductive particles included in the second layer are coalesced with each other, and also coalesced with the conductive particles included in the first layer.

Thus, in the created wiring, the conductive particles are coalesced with each other in the second layer, and also, the conductive particles of the second layer and the conductive particles of the first layer are coalesced with each other, thus preventing the wiring from coming off the substrate via the first layer adhered to the substrate.

Besides, since the first layer and the second layer are bonded together by coalescence between their respective conductive particles, the conductive particles for constituting the second layer can be selected with no account of adherence between the first layer and the second layer. On the other hand, the material of the first layer can be selected from any materials ensuring high adhesiveness with respect to the substrate, regardless of the material of the conductive particles constituting the second layer.

Accordingly, it is possible to provide a wiring material allowing use of a larger variety of materials, while also ensuring low resistance of wiring and improvement of adhesion between the wiring and the substrate.

Though the foregoing explanation deals with only a wiring substrate, the present invention is not limited to a wiring substrate or a wiring material, but may also be used for a substrate including various kinds of common thin film layer, i.e., a substrate on which a thin film layer is formed.

More specifically, the foregoing wiring material may instead be a thin film formed by fine particles.

Additional objects, features, and strengths of the present invention will be made clear by the description below. Further, the advantages of the present invention will be evident from the following explanation in reference to the drawings.

DESCRIPTION OF THE EMBODIMENTS

Figure 1:
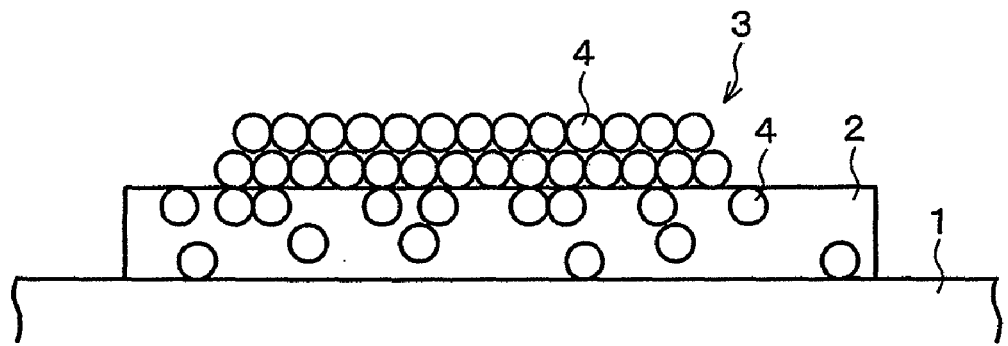
FIG. 1(a) is a cross-sectional view schematically illustrating a wiring material before baking.
FIG. 1(b) is a cross-sectional view schematically illustrating a wiring material after baking.
Figure 1:
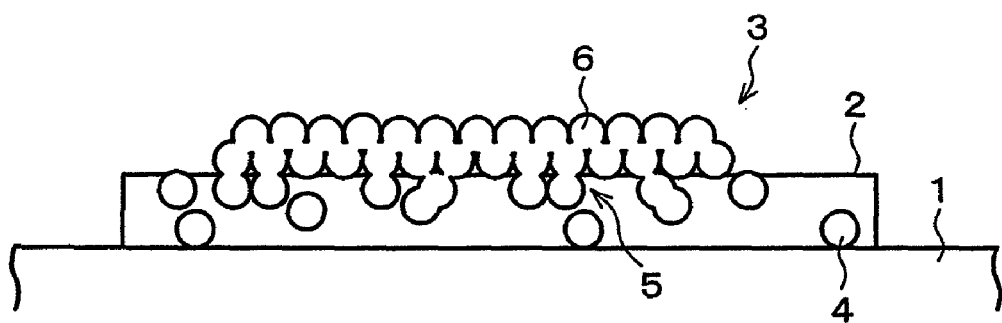

One embodiment of the present invention will be described below.

As shown in FIG. 1(a), the wiring material according to the present invention is made up of a substrate 1, a binder layer (a first layer) 2 having a binding function with respect to the substrate 1, and a wiring layer (a second layer) 3 made up of ultrafine metal particles 4 which are conductive particles. The binding layer 2 and the wiring layer 3 are laminated on the substrate 1. The wiring material with this structure is then subjected to sintering (processed by heat), so that the ultrafine metal particles 4 are coalesced with each other to become metal grains 5, and wiring 6 is formed on the binder layer 2 by the metal grain 5.

The binder layer 2 is made of an adhesive selected in consideration of adhesion strength with respect to the insulative substrate 1, for example, an ethoxy silane, and contains the ultrafine metal particles 4. The concentration of the metal particle 4 in the binder layer 2 is adjusted to be lower than that of the ultrafine metal particles 4 of the wiring layer 3. However, the concentration of the ultrafine metal particles 4 of the binder layer 2 has to be adjusted so that at least a part of the metal particle 4 of the binder layer 2 is in contact with the metal particle 4 of the wiring layer 3. Note that, the concentration of the ultrafine metal particles 4 will be described later.

The metal particle 4 has a diameter of not more than 100 nanometers (nm), and made of a metal such as Ag. The ultrafine metal particles 4 cause a particular phenomenon, such as melting point decrease, and therefore, as shown in FIG. 2, they are coalesced with each other by heating (baking) even at a temperature below the fusing point, and become metal grains 5. The metal grains 5 are then coalesced with more of the ultrafine metal particles 4 and form a metal film (the wiring 6 of FIG. 1(b)).

As described, the metal film is formed by metallic bond between the ultrafine metal particles 4. Generally, a metal atom easily discharges the outermost electron with less energy to be a cation. In the metallic bond, the respective atoms discharge their outermost electron, which are however shared by the atoms for bonding. The electrons shared by both atoms are free electrons, and can freely move around with no restriction of nuclear sight unlike rare gas, and therefore, they constitute a band structure in a solid body, and are used as a desirable leader for electrical conduction.

Incidentally, metal grains with a diameter of microns cause electrical conduction mostly from contact therebetween. In this case, electrical conduction can be performed by sharing free electrons as with the case above; however, the contact will be made only by points since the shapes of the grains do not change. Further, there is a possibility of occurrence of electrical conduction by a tunnel effect of an insulative substance between the grains in contact with each other. This conduction occurs with some contact resistance. More specifically, contact between metal grains having a diameter of microns causes some contact resistance, and thus the resistance value becomes higher than a bulk. Thus, such the use of such grains may be results in defective wiring.

On the other hand, a particle (with a diameter of not more than 100 nanometers) having a larger superficial area with respect to the bulk has greater particle energy. Thus, when such a particle is in contact with another, the shapes are changed, and also, they completely share their free electrons. These particles are not in contact with each other by their points, thus causing no contact resistance, meaning that the particles establish electrical conduction by being coupled with each other.

Figure 3:
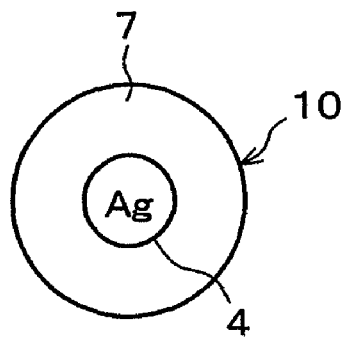
FIG. 3(a) is a pattern diagram illustrating a colloid particle containing a metal particle.
FIG. 3(b) is a drawing illustrating a solvent which therein keeps the colloid material of FIG. 3(a).
Figure 3:
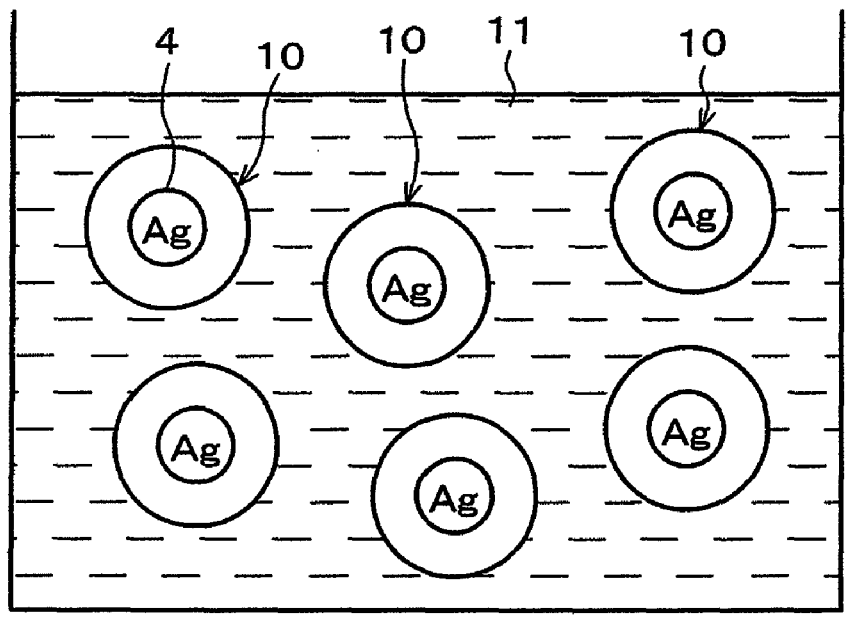

As described, the metal particle 4 causes coalescence (metallic bond) at relatively low temperature due to the melting point depression. Then, as shown in FIG. 3(a), the ultrafine metal particles 4 are coated with an organic material 7 to create colloid particles 10, and then, as shown in FIG. 3(b), the colloid particles 10 are dispersed in a solvent 11, such as an alcohol, to become a colloid material. Note that, the organic material 7 is omitted in FIG. 3(a) for ease of explanation.

Further, it is preferable that the same solvent is used for the solvent 11 in which the colloid particles 10 are dispersed, and for that in which an ethoxy silane is dissolved to create a binder layer 2. In this case of using the same solvent for the material of a binder layer 2 and the material of the wiring layer 3, these layers can be heated by the same temperature upon formation. Further, using the same solvent allows mixture of these layers with the colloid particles in the dispersion state.

The colloid material is applied to an object and then heated at 200° C. to 250° C. to become a metallic thin film. More specifically, in the colloid particles 10 of the colloid material, the organic material 7 on the surface of the ultrafine metal particles 4 evaporates by the heating, so that the ultrafine metal particles 4 are easily in contact with each other. The temperature of the heating, which may be any temperatures causing evaporation of the organic material 7 and normally lower than the fusing point of the metal particle 4, is hereinafter referred to as a sintering temperature.

When the wiring material having the foregoing arrangement is applied to the substrate 1 (FIG. 1(a)), the wiring layer 3 is laminated on the binder layer 2, so that a part of ultrafine metal particles 4 contained in the binder layer 2 as conductive particles are in contact with the ultrafine metal particles 4 constituting the wiring layer 3.

The substrate 1 in such a state is then subjected to sintering, so that the ultrafine metal particles 4 in the wiring layer 3 are coalesced with each other to become wiring, and also coalesced with the ultrafine metal particles 4 of the binder layer 2, which is in contact with the wiring layer 3. Here, the binder layer 2 and the wiring layer 3 are bonded together through the ultrafine metal particles 4 in them, and therefore, the wiring layer 3 is more securely coupled with the binder layer 2 than the bonding by intermolecular force. As shown in FIG. 1(b), the ultrafine metal particles 4 coalesced with each other become metal grains 5, and cause an anchor effect at the border of the binding layer 2 and the wiring layer 3, thus preventing the wiring 6 from coming off the binder layer 2.

Further, the binder layer 2 is adhered to the substrate 1 with its binder function, and therefore, the wiring 6 created by sintering the wiring layer 3 firmly coupled with the binder layer 2 is firmly coupled with the substrate 1 via the binder layer 2. Therefore, the wiring 6 is not likely to come off the substrate 1.

Further, since the binder layer 2 and the wiring layer 3 are coupled together by coalescence between the respective ultrafine metal particles 4, the ultrafine metal particles 4 constituting the wiring 3 can be selected regardless of the material of the binding layer 2. On the other hand, the material of the binder layer 2 can be selected from any materials with high adhesiveness for the substrate 1, regardless of the material of the ultrafine metal particles 4 constituting the wiring layer 3.

The wiring substrate of the present invention is created by forming wiring on a substrate, with the foregoing wiring material with the described characteristics.

Here, with reference to FIGS. 1(a) and 1(b), the following will explain a manufacturing method of a wiring substrate using the foregoing wiring material. Note that, the organic material 7 for coating the metal particle 4 is omitted in FIG. 1(a).

For the first step, an adhesive made of a material ensuring high adhesiveness to a substrate and containing a small amount of ultrafine metal particles 4 is applied to the substrate 1 so as to create the binding layer 2.

For the second step, as shown in FIG. 1(a), the colloid material made of the ultrafine metal particles 4 is applied on the wiring layer 3.

For the third step, the substrate 1 in the state shown in FIG. 1(a) is then sintered so as to evaporate the organic material (not shown) with which the ultrafine metal particles 4 are coated, so as to bring the ultrafine metal particles 4 into direct contact with each other. As a result, as shown in FIG. 1(b), the ultrafine metal particles 4 are coalesced with each other, and form wiring 6 on the binder layer 2.

In the third step, in addition to coalescence between the ultrafine metal particles 4 inside the wiring layer 3, the ultrafine metal particles 4 of the wiring layer 3 and the ultrafine metal particles 4 of the binder layer 2 are also coalesced with each other.

Namely, the manufacturing method of a wiring substrate according to the present invention includes the first step for forming a first layer containing conductive particles and having a binder function to be adhered to a substrate; the second step for forming on the first layer formed in the first step a second layer containing conductive particles; and the third step for subjecting the first and second layers laminated to each other to heat processing, so as to coalesce the conductive particles of the first layer and the conductive particles of the second layer at the border of the first and second layers.

Further, in the foregoing method, it is preferable that the same solvent is used for the first solvent containing the material of the first layer and is applied to the substrate so as to create the first layer through sintering, and for the second solvent containing the material of the second layer and is applied to the first layer so as to create the second layer through sintering.

In the wiring substrate thus created through such a method, the binder layer 2 (the first layer) ensures secure adhesiveness with the substrate 1 and also has a function of fixing the ultrafine metal particles 4 (the particle materials) into inside and surface thereof. The ultrafine metal particles 4 as particles for constituting the wiring layer 3 (the second layer) are coalesced with each other through sintering and form a metal layer (wiring layer 6), and also are coalesced with the ultrafine metal particles 4 of the binder layer 2. As a result, the wiring layer 3 is securely adhered to the binder layer 2 by an anchor effect from the ultrafine metal particles 4 as a metal material of the binder layer 2.

Therefore, the wiring 6 made of the metal material of the wiring layer 3 is adhered to the substrate 1 via the binding layer 2. Thus the wiring 6 is not likely to be removed from the substrate 1.

As described, the manufacturing method of a wiring substrate according to the present invention differs from a method of using a metal complex by causing adherence between the substrate and the respective layers with metal-organic material bonding and organic material-substrate bonding. However, in such a method with bonding between metal-organic-substrate, combination of the materials is limited to cause metal-organic bonding, and therefore the pair has to be selected from a relatively narrower range. On the other hand, the manufacturing method of the present invention can be performed for any pairs of material with the same forming manner, the same bonding manner, and the same bonding theory. Therefore, in the present invention, materials for the binder layer 2 and the wiring layer 3 can be selected from a wider range.

The following will explain a concrete example of the present invention.

Firstly, with a glass substrate made of a #1737 non-alkali glass as the substrate 1, an ethoxy silane for the adhesive material as a main component of the binder layer 2, and ultrafine particles (with a diameter of not more than 20 nm) of silver (Ag) for the metal material as the ultrafine metal particles 4; there was examined changes of adhesiveness by the Ag ultrafine particles contained in the ethoxy silane of the binder layer 2. In this examination, as shown in FIGS. 3(a) and 3(b), the Ag ultrafine particles were coated with organic material 7 to be colloid particles 10 (hereinafter referred to as an Ag colloid material).

Firstly, the substrate 1 was coated with the Ag colloid material through spin coating, and the adhesiveness thereof was examined after baking, with a tape peeling method (hereinafter referred to as a peel test) by cross-hatching. Note that, the baking was carried out at 200° C.

The examination revealed that the resistance value of the film formed on the substrate 1 was 2 to 4 $\mu\Omega\cdot$cm, which is low enough for a wiring material. However, it was found that this example ensures no adhesiveness, since the film was entirely peeled-off after the peel test.

Next, the ethoxy silane was added to the Ag colloid material as an adhesive material, and the resistance value of the film was measured for this Ag colloid material.

Figure 4:
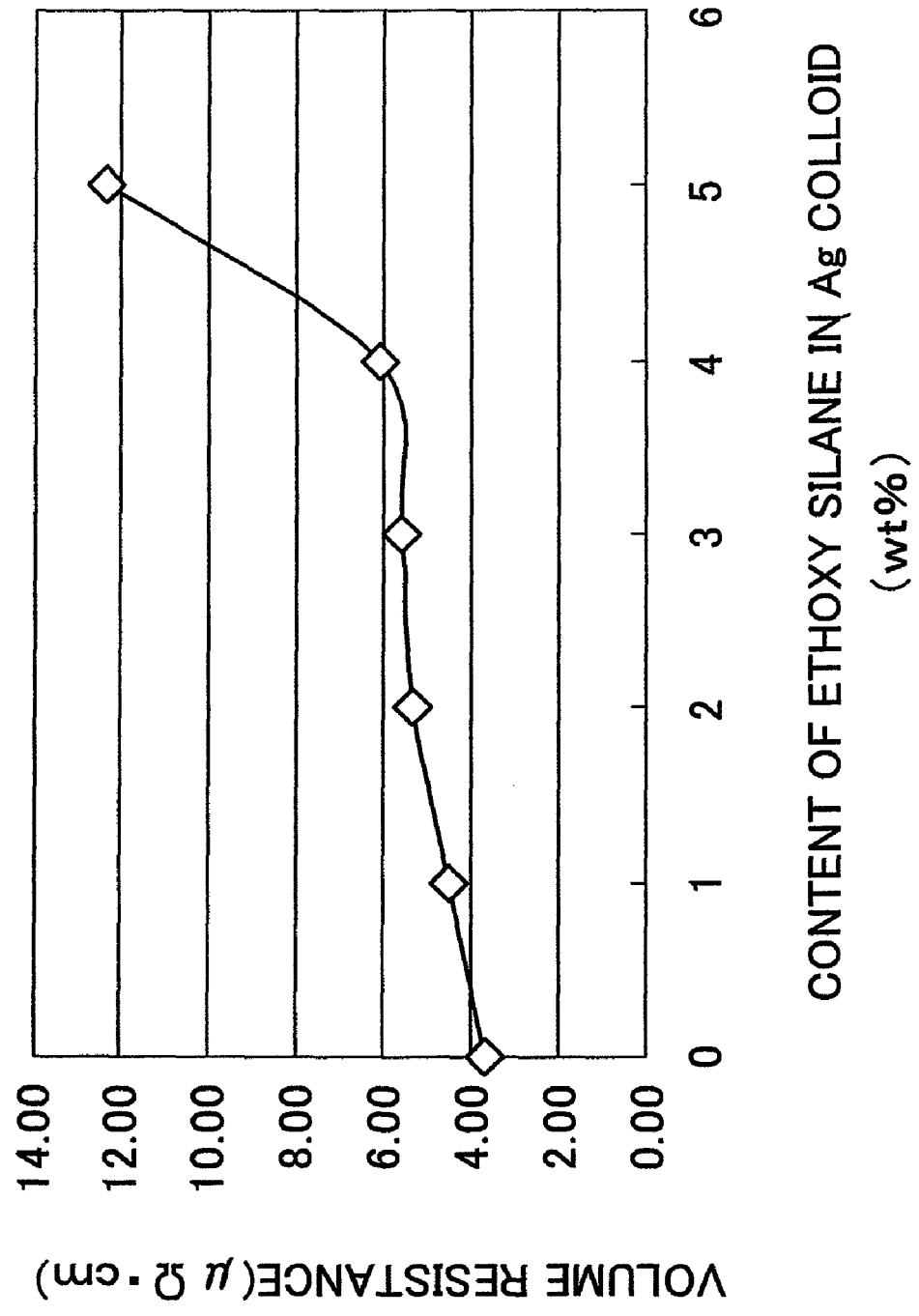
FIG. 4 is a graph showing a relation between content of ethoxy silane and volume resistance of an Ag colloid.

FIG. 4 is a graph showing the volume resistance of the film with respect to content of ethoxy silane in the Ag colloid.

The graph of FIG. 4 reveals that the volume resistance value exceeds 10.00 $\mu\Omega\cdot$cm when the content of ethoxy silane in the Ag colloid material exceeds 4 wt %.

Generally, wiring used for a liquid crystal panel has a resistance value of 3 to 5 $\mu\Omega\cdot$cm.

However, those larger liquid crystal panels in recent years require a longer wiring length, and therefore there have been demands for wiring with lower resistance. Such a demand can be met with the conventional resistance value by using wiring having a wider width and a larger thickness; however, there are limits for such increases of width and thickness.

An increase of wiring width induces a decrease of aperture ratio, and thus the backlight has to have higher luminance. Since the higher luminance consumes more power, the increase of width is limited. Meanwhile, the increase of thickness induces higher risk of breakage of wiring due to level differences at intersections of wiring. This may cause a decrease of yield, and therefore the increase of thickness is also limited.

The foregoing volume resistance value of 10.00 $\mu\Omega\cdot$cm is 2-3 times a general resistance value (3 to 5 $\mu\Omega\cdot$cm) used for a liquid crystal panel, meaning that either of the width and thickness has to be increased by 2-3 times. Since reduction of resistance value is unlikely with such an increase of width or thickness, the foregoing volume resistance value is inadequate for wiring resistance.

Next, the relation between the adhesiveness of the Ag colloid material to the substrate 1 and the content of ethoxy silane were examined, as shown in Table 1. Note that, Table 1 shows a result of a peel test for finding out adhesiveness of the Ag colloid material. The result shows that the adhesiveness appears with the ethoxy silane of 5 wt %.

TABLE 1

| | CONTENT OF ETHOXY SILANE (wt %) | | | | | | |
|---|---|---|---|---|---|---|---|
| | 1 | 2 | 3 | 4 | 5 | 6 | 7 |
| ADHESIVENESS | X | X | X | Δ | ○ | ○ | ○ |

In Table 1, × denotes that the film was entirely peeled off, Δ denotes that about half of the film was peeled off, and ○ denotes that the entire film remained without being peeled off.

With the examinations regarding the resistance value and the adhesiveness, it is found that there are some difficulties to realize both desirable adhesiveness of the Ag colloid material to the substrate 1, and a desirable resistance value.

In view of this problem, there was carried out a different method of forming wiring with two layers: a layer for ensuring adhesiveness (binder layer) and a layer for realizing low resistance (wiring layer), which are provided as an upper layer and a lower layer with different contents of Ag ultrafine particles. The binder layer contains an ethoxy silane to improve its adhesiveness, but the wiring layer does not contain an ethoxy silane so as to realize low resistance, since an ethoxy silane will function as a wiring resistance.

In this method, the wiring layer as the upper layer has no components except for the Ag colloid material. Therefore, it is possible to offer lower resistance value compared to the conventional method of adhering the wiring into the substrate by applying silica or an adhesive after the wiring is formed. Further, this method allows easy electric contact from the upper side of the wiring, thus simplifying addition of other wiring material (such as an ITO) onto the formed wiring.

Figure 5:
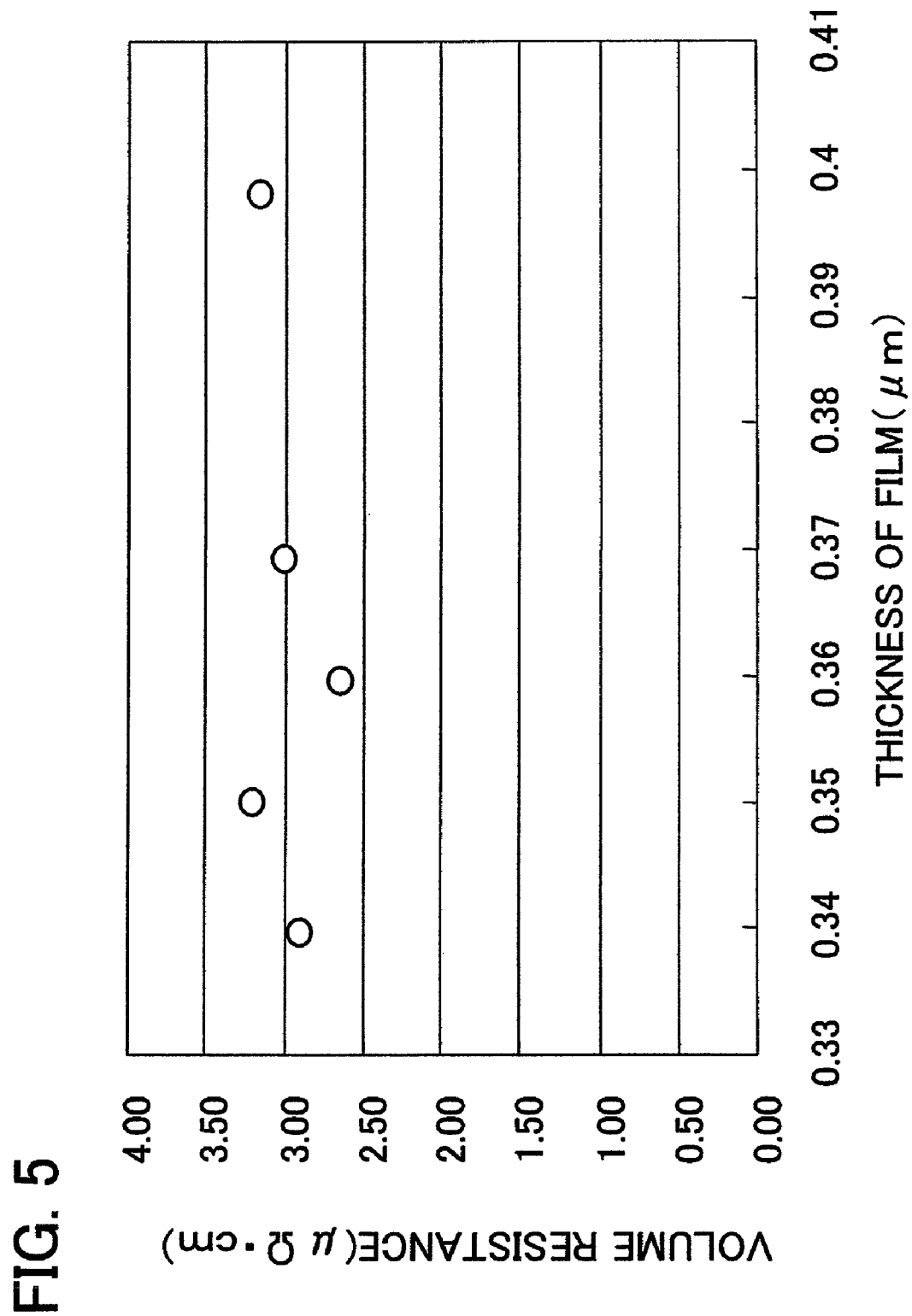
FIG. 5 is a graph illustrating a relation between thickness and volume resistance of an Ag film.

FIG. 5 is a graph showing changes of volume resistance with respect to the thickness of the wiring 6 which includes the foregoing wiring substrate made up of two wiring material layers. In this example, the binder layer 2 is made of a wiring material with an ethoxy silane of 90 wt % and Ag colloid material of 10 wt %, while the other, the wiring layer 3, is made of an Ag colloid material of 100 wt %.

The graph of FIG. 5 shows that, in the wiring 6, variation of the thickness (from 0.34 μm to 0.40 μm) causes only small changes of the volume resistance. In this wiring 6, the resistance value was kept in a desirable range when the thickness is in a range from 0.3 μm to 0.4 μm, which is practical thickness for the wiring 6. Moreover, the resistance value in this example was kept in a desirable range, from 2.7 to 3.8 $\mu\Omega\cdot$cm.

Figure 6:
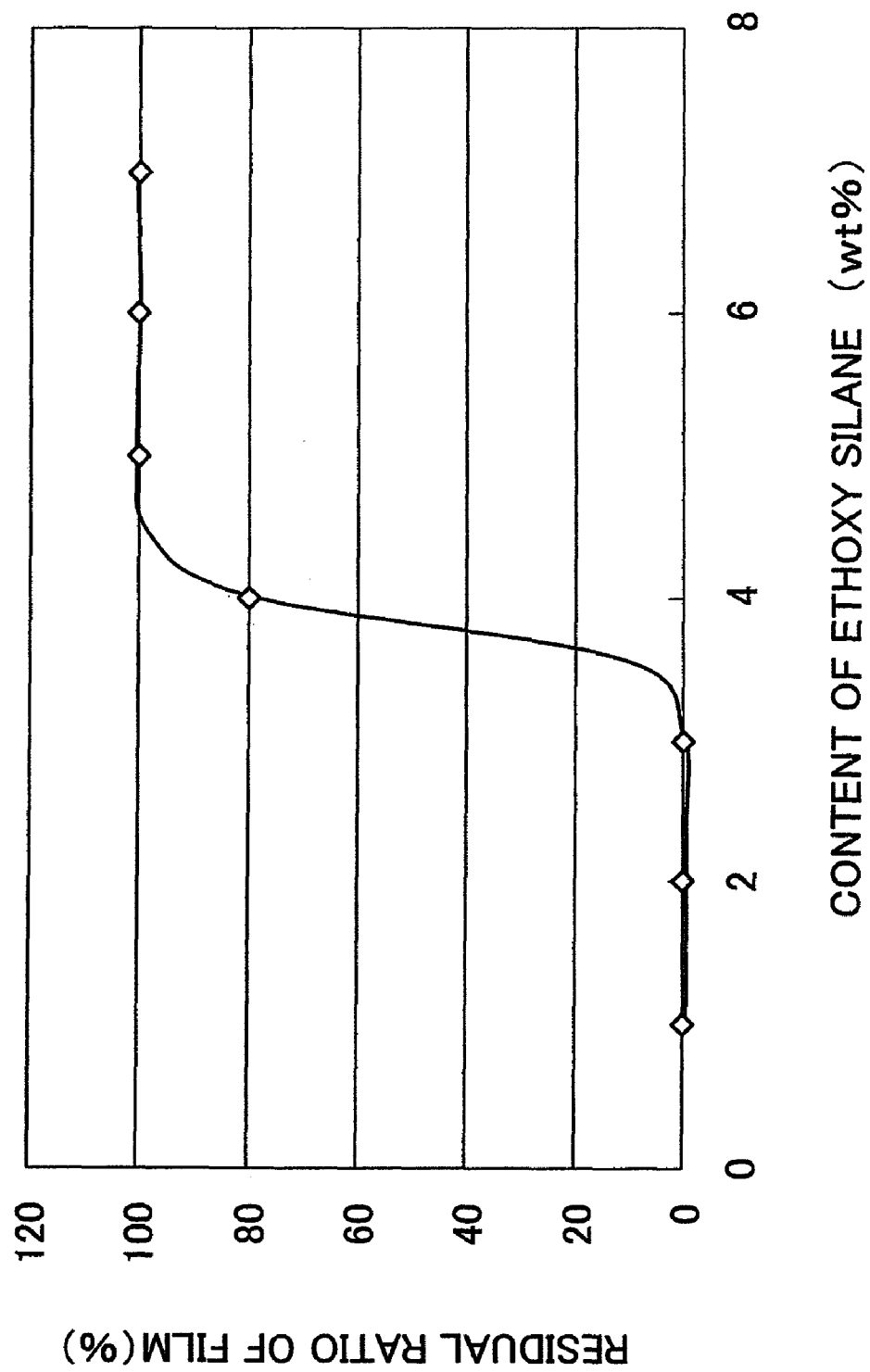
FIG. 6 is a graph illustrating a relation between content of ethoxy silane and film residual ratio of the Ag film when only one film is formed.
Figure 7:
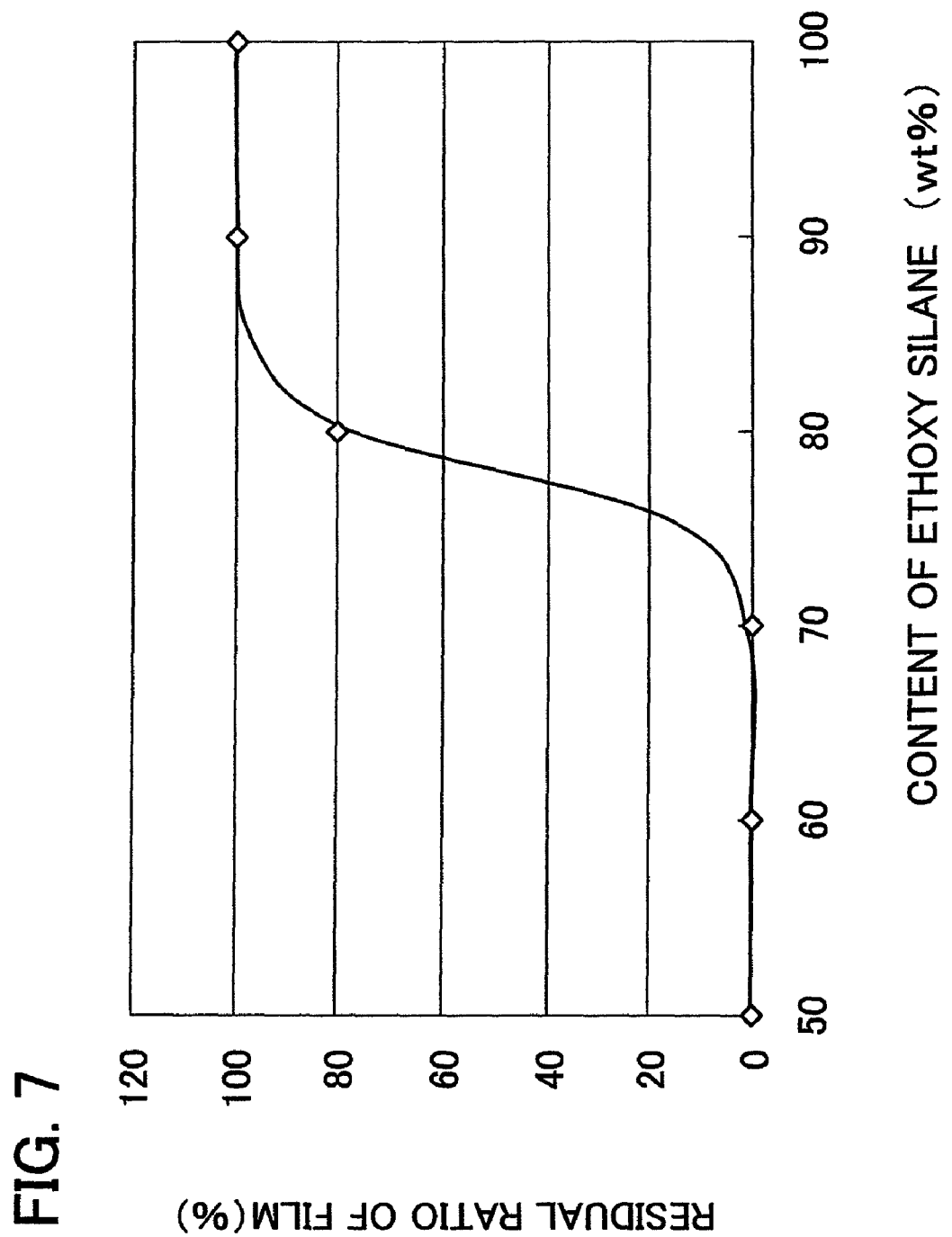
FIG. 7 is a graph illustrating a relation between content of ethoxy silane and film residual ratio of the Ag film when two films are formed.
Figure 8:
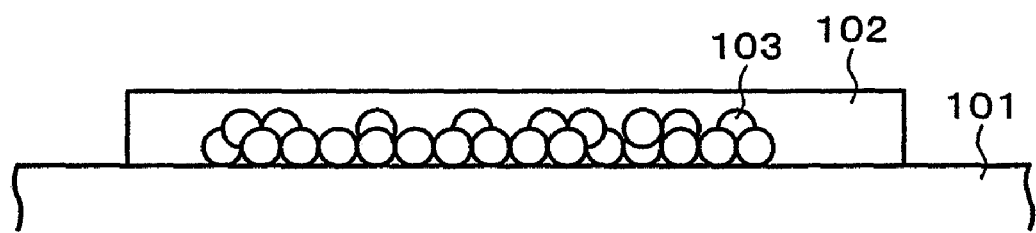
FIG. 8 is a cross-sectional view schematically illustrating a conventional wiring substrate.

Next, adhesiveness of the film was examined. FIGS. 6 and 7 show a result of measurement of residual ratio of a film, which indicates changes thereof with respect to content of ethoxy silane. This example uses a film including a lower layer by an Ag colloid material containing an ethoxy silane. FIG. 6 shows a measurement result of residual ratio of a film having only one layer, and FIG. 7 shows a measurement result of residual ratio of a film having two layers: a film of 100% Ag colloid material, and a layer containing an ethoxy silane.

Figure 2:
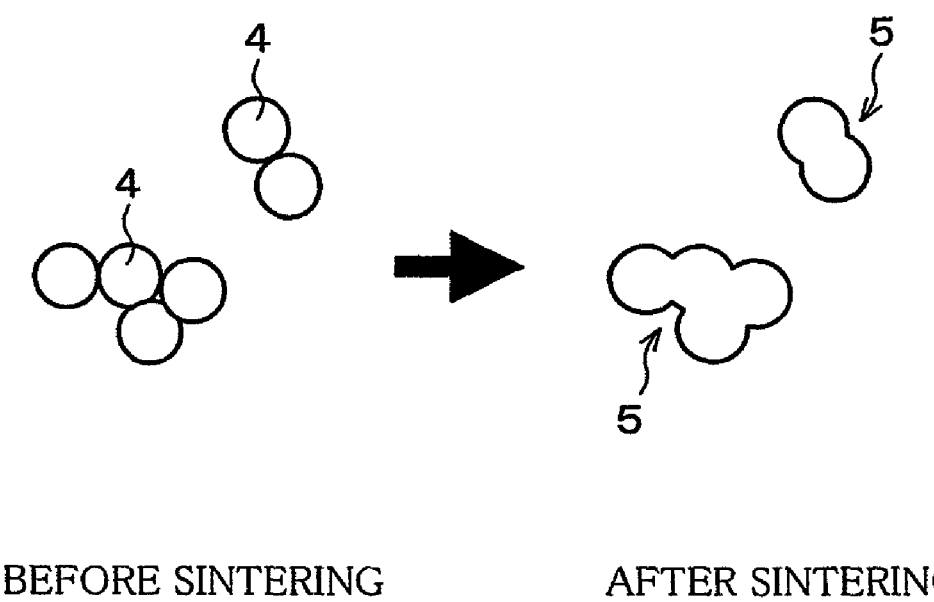
FIG. 2 is a drawing illustrating metal particles before and after baking.

In the example of FIG. 6, as with FIG. 1, the residual ratio starts increasing at the content of ethoxy silane=4 wt %, and the most of the film remains when the content becomes greater than 5 wt %. Namely, in the case of providing only one layer, the adhesiveness between the film and the substrate can be ensured by including an ethoxy silane of equal to or greater than 5 wt % in the Ag colloid material.

However, in this case of including an ethoxy silane of equal to or greater than 5 wt %, the resistance value of the film increases, thus spoiling the function as wiring.

FIG. 7 shows a case of providing two layers. In this example, the residual ratio of the film with two layers starts increasing at around the content of ethoxy silane=80 wt %, and the ratio becomes substantially 100% when the content of ethoxy silane becomes greater than 90 wt %.

Therefore, if the second layer is formed after sintering the first layer, it is necessary to include an ethoxy silane of greater than 90 wt % in the first layer to ensure secure adhesiveness between the two layers.

Further, when the lower layer contains 90 wt % of an ethoxy silane and 10 wt % of Ag colloid material, the volume resistance of the film with two layers becomes lower than 3.0 μΩ·cm, which is close to that of a layer containing only an Ag colloid material.

Accordingly, in order to obtain desirable adhesiveness to the substrate 1 and a low resistance, a wiring substrate is preferably created by a wiring material having two laminated layers: a binder layer 2 containing 90 wt % of an ethoxy silane and 10 wt % of Ag colloid material, and a wiring layer 3 containing 100 wt % of Ag colloid material. Note that, the Ag colloid material used in the method above is a colloid solution with a solid content of 50 wt % that includes Ag. Further, in the layer containing an ethoxy silane and 10 wt % of an Ag colloid material, the amount of Ag colloid material is a total amount of solid content and the solvent.

Here, with such a wiring material, the following will explain a method of forming wiring on the foregoing wiring substrate.

Firstly, a substrate is coated with an ethoxy silane containing a small amount of Ag, through spin coating. In the present embodiment, the content of Ag colloid was specified as 10% so as to ensure adhesiveness to the substrate and low resistance of wiring.

Thereafter, the substrate coated with the ethoxy silane was baked at 200° C. for 60 minutes.

Next, the baked substrate was further coated with an Ag colloid material through spin coating, and was again baked at 200° C. for 60 minutes.

Then, a resist material was applied on the film formed through the second baking. The resist was patterned into an arbitrary shape by photolithography with a mask. Finally, the Ag material was etched, and there was created a wiring pattern.

For the etching process, both wet etching and dry etching may be used. However, when the Ag layer on the surface is removed by, particularly wet etching, the ethoxy silane layer containing a small amount of Ag may remain on the surface. The remained layer however does not have to be taken into account since it contains only a small amount of Ag, and its resistance value is almost as great as an insulative substance.

Further, the first layer of an ethoxy silane may be removed by dry etching, such as a milling process with Ar gas, or reactive ion etching with CF4 gas and $O_2$ gas.

Alternatively, the wiring may also be formed by an inkjet printer, as follows.

As the first step, a guide for leading the wiring material was created on a glass by a resist. Then, the surface of the glass was processed to be lyophilic by using $O_2$ plasma, and the resist area was processed to be lyophobic by using CF4 or the like.

Thereafter, a wiring material was applied to the area where the wiring was supposed to be formed by an inkjet head. Here, the wiring material was made of an ethoxy silane containing a small amount of Ag. The substrate was then baked at 200° C. for 60 minutes, and further coated with an Ag material by an inkjet head, followed by another baking at 200° C. for 60 minutes to complete the wiring.

In the present embodiment, the binder layer 2 includes an ethoxy silane as the main component, and Ag was used as the metal material included in the wiring material; however, the present invention also allows use of other materials.

For example, the ethoxy silane as the main component of the binder layer 2 may instead be such as tetra ethoxy silane, methyl triethoxy silane, or dimethyl diethoxy silane. Otherwise, it may be tetra methoxy silane, methyl trimethoxy silane, or dimethyl dimethoxy silane or the like. A silane coupling agent having an alkoxyl group is typically used for the material.

Further, apart from Ag, the metal material used for the wiring material may also be Au, Ni, or Cu, as well as an alloy of Cu/Ag etc.

Note that, it is not necessary to use the same material for the metal material of the binder layer 2 and the metal material of the wiring material 3.

Further, though the metal material is used as a conductive material in the example above, other kinds of conductive material may also be used, for example, an oxide, such as ITO (Indium Tin Oxide), ZnO or the like.

As described, a wiring material according to the present invention, for forming wiring on a substrate by causing coalescence of conductive particles through heating includes: a first layer containing conductive particles and having a binder function to be adhered to the substrate; and a second layer containing conductive particles and laminated on the first layer.

With the foregoing arrangement in which the first layer and the second layer are laminated to each other, the conductive particles of the first layer are partly in contact with the conductive particles of the second layer.

By carrying out heat processing with such an arrangement, the conductive particles included in the second layer are coalesced with each other to become wiring, and also coalesced with the conductive particles included in the first layer which is in contact with the second layer. Thus, the conductive particles in the first layer and the conductive particles in the second layer are coalesced with each other. Further, the conductive particles included in the first layer are firmly adhered to the first layer with the binding function. Further, the created wiring includes the conductive particles coalesced with each other through the heat processing, thus offering low resistance to the created wiring.

Therefore, the wiring formed by subjecting the second layer to heat processing is also firmly connected to the first layer. Further the first layer is adhered to the substrate with its binding function. Accordingly, the wiring formed by subjecting the second layer, which is firmly bonded to the first layer, to heat processing is also firmly connected to the substrate via the first layer, thus preventing the wiring from coming off the substrate.

Besides, since the first layer and the second layer are coupled together by coalescence between the respective conductive particles, the conductive particles for constituting the second layer can be selected with no account of adherence between the first layer and the second layer. On the other hand, the material of the first layer can be selected from any materials ensuring high adhesiveness with respect the substrate, regardless of the material of the conductive particles constituting the second layer.

Accordingly, it is possible to provide a wiring material allowing use of a larger variety of materials, while also ensuring low resistance of wiring and improvement of adhesion between the wiring and the substrate.

Generally, the first layer is supposed to include a small amount of conductive particles so as to improve adhesiveness to the substrate, and the second layer is supposed to include a large amount of conductive particles for realizing low resistance wiring.

In this view, the foregoing wiring material can be arranged so that the first layer includes the conductive particles with lower concentration than that of the conductive particles of the second layer.

Further, the first layer may include a main component same as a main component of the substrate.

With this arrangement, the adhesiveness between the first layer and the substrate can be improved. The main component preferably contains an alkoxyl group, so as to further improve the adhesiveness.

As described, the wiring substrate according to the present invention includes: a first layer containing conductive particles and adhered to a substrate; and a second layer operating as a wiring layer made of a conductive material and laminated on the first layer, the conductive particles of the first layer and the conductive material of the second layer are coalesced with each other at a border of the first layer and the second layer so as to generate an anchor effect for unifying the first layer and the second layer.

Therefore, the first layer is adhered to the substrate, and the first layer and the second layer are bonded together by the anchor effect, thus preventing the second layer from coming off the substrate via the first layer.

Further, the first layer and the second layer are bonded together by the anchor member, the conductive particles for constituting the first layer can be selected with no account of adherence with the material of the second layer. More specifically, the material of the first layer can be selected only by taking account of adhesiveness with respect to the substrate.

Accordingly, the material of wiring may be selected from a larger variety.

The foregoing wiring material may be arranged so that the conductive particles are metal ultrafine particles, and the conductive material is a metal material, and the anchor member is made of metal grains created from the ultrafine metal particles and the metal material.

In this case, since the conductive material made of a metal material easily realizes low resistance of the second layer, it is possible to realize a wiring material offering low resistance of wiring and ensuring adhesion between the wiring and the substrate.

The metal grains are preferably created by metallic bond of the ultrafine metal particles and the metal material.

In this case, the metal particles and the metal material are coalesced through metallic bond by being fused, the first layer and the second layer as the wiring layer may be more firmly bonded.

As described, a manufacturing method of a wiring substrate according to the present invention includes the steps of: (a) forming a first layer on a substrate, the first layer containing conductive particles and having a binder function to be adhered to the substrate; (b) forming on the first layer formed in the step (a) a second layer containing conductive particles; and (c) subjecting the first and second layers laminated to each other to heat processing, so as to coalesce the conductive particles of the first layer and the conductive particles of the second layer at a border of the first and second layers.

With this method of subjecting the first layer and the second layer laminated to each other to heat processing, the conductive particles included in the second layer are coalesced with each other, and also coalesced with the conductive particles included in the first layer.

With this arrangement, in the created wiring, the conductive particles in the second layer are coalesced with each other, and also coalesced with the conductive particles in the first layer, thus preventing the wiring from coming off the substrate via the first layer adhered to the substrate.

Besides, since the first layer and the second layer are coupled together by coalescence between the respective conductive particles, the conductive particles for constituting the second layer can be selected with no account of adherence between the first layer and the second layer. On the other hand, the material of the first layer can be selected from any materials ensuring high adhesiveness with respect the substrate, regardless of the material of the conductive particles constituting the second layer.

Accordingly, it is possible to provide a wiring material allowing use of a larger variety of materials, while also ensuring low resistance of wiring and improvement of adhesion between the wiring and the substrate.

The foregoing manufacturing method may be carried out in such a manner that the step (a) for forming the first layer is carried out by coating the substrate with a first solution containing a material of the first layer, and then baking the substrate, the step (b) for forming the second layer is carried out by coating the first layer with a second solution containing a material of the second layer, and then baking the first layer which has been supplied with the second solution, the first solution and the second solution using a same solvent.

In this case of using the same solvent for the material of the first layer and the material of the second layer, these layers can be heated by the same temperature in the respective manufacturing steps.

Note that, the wiring substrate of the present invention is used for a liquid crystal display panel in the foregoing embodiment; however, the present invention is not limited to the use with the liquid crystal display device but rather may be applied for other types of display panels, such as a PDP (Plasma Display Panel), an organic EL (Electroluminescence) panel, or an inorganic EL panel.

Further, as described, the present invention is not limited to the wiring material but may also be adopted for any kinds of thin film (fine particle thin film) formed from fine particles. The thin film may be either as such or processed. The fine particles in this case may be metal fine particles. Therefore, the thin film formed from fine particle thin film material of the present invention may be an ultrafine particle metal film.

The ultrafine metal film may be used for, for example, a reflection board, an electromagnetic shield board, an electrode material for a filter, or a substrate of a decorative metal thin film. In such usages, a metal thin film may be used as an alternative of a thin metal film formed through sputtering, deposition, CVD, or coating.

For example, in the example shown in FIG. 1(a) and FIG. 1(b) which have been explained in the present embodiment, the binder layer (the first layer) 2 and the wiring layer (the second layer) 3, which are used as a wiring material, may constitute a fine particle thin film material. More specifically, the binder layer 2 is formed on the whole surface of the substrate 1; and instead of the wiring layer 3, an ultrafine particle metal film (the second layer) made of a ultrafine metal particles 4 is formed on the binder layer (the first layer) 2. In this manner, it is possible to create an ultrafine particle metal film (a reflection board etc.) made of a fine particle thin film material.

Similarly, by using different metal particles according to usage, the first layer and the second layer may be formed as the electromagnetic shield board, the electrode material for a filter, the substrate of a decorative metal thin film etc.

In the present embodiment, apart from Ag, the uses of Au, Ni, or Cu are suggested as a metal material used for the wiring material, as well as an alloy of Cu/Ag etc. Then, for the metal material to create the fine particle thin film material; apart from Ag, the use of a noble metal such as Au, Pt, or Pd, is suggested. The metal material may also be selected from other metals according to usage.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A wiring material for forming wiring on a substrate by causing coalescence of conductive particles through heating, comprising:
   a first layer containing an adhesive material functioning as a binder to adhere to the substrate, the adhesive material containing metal particles made of metal material with a diameter of not more than 100 nm; and
   a second layer containing conductive particles made of a conductive material with a diameter of not more than 100 nm and laminated on the first layer, wherein the first layer and the second layer are coupled by coalescence between the metal particles of the first layer and the conductive particles of the second layer through heating, wherein
   the metal particles that are in contact with each other in the first layer are coupled by coalescence, and
   the conductive particles that are in contact with each other in the second layer are coupled by coalescence.

2. The wiring material as set forth in claim 1, wherein: the conductive particles are metal particles.

3. The wiring material as set forth in claim 1, wherein: the conductive particles made of said conductive material are coalesced with each other through heating at a temperature below a melting point of a bulk material of the conductive material.

4. The wiring material as set forth in claim 3, wherein: the conductive material is an Ag.

5. The wiring material as set forth in claim 3, wherein: the metal particles of the first layer and the conductive particles of the second layer are made of the same conductive material.

6. The wiring material as set forth in claim 1, wherein: the first layer includes the metal particles with lower concentration than that of the conductive particles of the second layer.

7. The wiring material as set forth in claim 1, wherein: the first layer includes a main component same as a main component of the substrate.

8. The wiring material as set forth in claim 1, wherein the coalescence between the metal particles and the conductive particles corresponds to uniting pairs of metallic particles.

9. The wiring material as set forth in claim 1, wherein the conductive particles in the second layer are coalesced through heating to form a wiring layer.

10. The wiring material as set forth in claim 1, wherein a size of the metal particles of the first layer and a size of the conductive particles of the second layer are such that a melting point of the metal particles of the first layer and a melting point of the conductive particles of the second layer are lowered from that of a bulk state of the same material of the respective particles.

11. A fine particle thin film material for forming thin films on a substrate by causing coalescence of conductive particles through heating, comprising:
   a first layer containing an adhesive material functioning as a binder to the substrate, the adhesive material containing metal particles made of metal material with a diameter of not more than 100 nm; and
   a second layer containing conductive particles made of a conductive material with a diameter of not more than 100 nm and laminated on the first layer, wherein
   the first layer and the second layer are coupled by coalescence between the metal particles of the first layer and the conductive particles of the second layer through heating, wherein
   the metal particles that are in contact with each other in the first layer are coupled by coalescence, and
   the conductive particles that are in contact with each other in the second layer are coupled by coalescence.

12. The fine particle thin film material as set forth in claim 11, wherein:
   the conductive particles of the second layer are metal particles.

13. The fine particle thin film material as set forth in claim 11, wherein:
   the conductive material is an Ag.

14. The fine particle thin film material as set forth in claim 11, wherein:
   the first layer includes the metal particles with lower concentration than that of the conductive particles of the second layer.

15. The fine particle thin film material as set forth in claim 11, wherein:
   the first layer includes a main component same as a main component of the substrate.

16. A substrate having thin film layers, comprising:
   a first layer containing an adhesive material functioning as a binder to adhere to a substrate, the adhesive material containing metal particles made of metal material with a diameter of not more than 100 nm; and
   a second layer operating as a wiring layer made of a conductive material and laminated on the first layer,
   the metal particles of the first layer and the conductive material of the second layer are coalesced with each other so as to form an anchor member for uniting the first layer and the second layer, said coalescing is carried out through heating, wherein
   the anchor member having a part formed by coalescence of the metal particles that are in contact with each other in the adhesive material.

17. The substrate having thin film layers as set forth in claim 16, wherein:
   the conductive material is a metal material, and the anchor member is made of metal grains created from the metal particles and the metal material.

18. The substrate having thin film layers as set forth in claim 17, wherein:
   the metal grains are created by metallic bond of the metal particles and the metal material.

19. A wiring material comprising:
   a first layer containing an adhesive material functioning as a binder to adhere to a substrate; and
   a second layer, laminated on the first layer, which serves as a conductor,
   wherein the second layer has conductive protrusions that extend from a surface of the conductor of the second layer into the first layer,
   wherein the protrusions include a plurality of conductive particles that are bonded to one another, wherein each of the plurality of conductive particles has a particle diameter of not more than 100 nm.

20. The wiring material as set forth in claim 19, wherein: the plurality of conductive particles are partially bonded to one another.

21. The wiring material as set forth in claim 19, wherein: the plurality of conductive particles are metallic-bonded to one another.

22. The wiring material as set forth in claim 19, wherein: the plurality of conductive particles are partially fused to one another.

23. The wiring material as set forth in claim 19, wherein: the plurality of conductive particles are nanoparticles.

* * * * *